(12) United States Patent
Stute

(10) Patent No.: US 10,571,529 B2
(45) Date of Patent: Feb. 25, 2020

(54) ELECTRICAL STRUCTURAL MEMBER AND PRODUCTION METHOD FOR PRODUCING SUCH AN ELECTRICAL STRUCTURAL MEMBER

(71) Applicant: TE Connectivity Sensors Germany GmbH, Dortmund (DE)

(72) Inventor: Georg Stute, Velbert (DE)

(73) Assignee: TE Connectivity Sensors Germany GmbH, Dortmund (DE)

( * ) Notice: Subject to any disclaimer, the term of this patent is extended or adjusted under 35 U.S.C. 154(b) by 0 days.

(21) Appl. No.: 15/861,076

(22) Filed: Jan. 3, 2018

(65) Prior Publication Data
US 2018/0128883 A1     May 10, 2018

Related U.S. Application Data

(63) Continuation of application No. PCT/EP2016/001141, filed on Jul. 4, 2016.

(30) Foreign Application Priority Data

Jul. 3, 2015    (DE) .................. 10 2015 008 503

(51) Int. Cl.
*G01R 33/00*     (2006.01)
*G01D 11/24*     (2006.01)
(Continued)

(52) U.S. Cl.
CPC ....... *G01R 33/0047* (2013.01); *G01D 11/245* (2013.01); *G01R 33/022* (2013.01);
(Continued)

(58) Field of Classification Search
CPC .... G01R 33/09; G01R 33/047; G01R 33/022; G01B 7/30; G01D 11/245; H01L 23/3107;
(Continued)

(56) References Cited

U.S. PATENT DOCUMENTS 3,746,934 A * 7/1973 Stein .................. H01L 23/5385
                                              174/265
5,377,077 A * 12/1994 Burns .................. H01L 21/565
                                              165/185
(Continued)

FOREIGN PATENT DOCUMENTS

EP          0607595 A2    7/1994
WO    2017005359 A1    1/2017

OTHER PUBLICATIONS

Partial English Translation of WO2016EP01141, 2016.*
(Continued)

*Primary Examiner* — Patrick Assouad
*Assistant Examiner* — Demetrius R Pretlow
(74) *Attorney, Agent, or Firm* — Barley Snyder

(57) ABSTRACT

An electrical structural member comprises a first package and a second package. The first package has a first connection frame, a chip disposed in the first connection frame, and a first encapsulation material encapsulating the chip and at least portions of the first connection frame. The second package has a second connection frame and a second encapsulation material encapsulating at least portions of the second connection frame. The first encapsulation material is securely connected to the second encapsulation material.

16 Claims, 8 Drawing Sheets

(51) Int. Cl.
    *H01L 25/10*     (2006.01)
    *H01L 25/16*     (2006.01)
    *G01R 33/022*     (2006.01)
    *H01L 23/31*     (2006.01)
    *H01L 23/495*     (2006.01)
    *G01R 33/09*     (2006.01)

(52) U.S. Cl.
    CPC .... *H01L 23/3107* (2013.01); *H01L 23/49548* (2013.01); *H01L 25/10* (2013.01); *H01L 25/105* (2013.01); *H01L 25/16* (2013.01); *G01R 33/096* (2013.01); *H01L 23/49541* (2013.01); *H01L 2225/1064* (2013.01)

(58) Field of Classification Search
    CPC ......... H01L 23/49548; H01L 23/49537; H01L 27/00; H01L 25/105; H01L 25/16
    USPC ............................................ 324/207.25, 252
    See application file for complete search history.

(56) References Cited

U.S. PATENT DOCUMENTS

| | | | | |
|---|---|---|---|---|
| 5,446,620 | A * | 8/1995 | Burns | H01L 21/565 |
| | | | | 165/185 |
| 5,455,740 | A * | 10/1995 | Burns | H01L 23/49555 |
| | | | | 257/685 |
| 5,621,377 | A | 4/1997 | Dettmann et al. | |
| 5,744,827 | A * | 4/1998 | Jeong | H01L 23/4951 |
| | | | | 257/673 |
| 5,801,437 | A * | 9/1998 | Burns | H01L 23/16 |
| | | | | 257/685 |
| 6,242,285 | B1 * | 6/2001 | Kang | H01L 23/50 |
| | | | | 438/109 |
| 6,404,662 | B1 * | 6/2002 | Cady | G11C 5/02 |
| | | | | 257/686 |
| 6,462,408 | B1 * | 10/2002 | Wehrly, Jr. | H01L 25/105 |
| | | | | 257/666 |
| 6,937,010 | B1 | 8/2005 | Takashima et al. | |
| 7,372,141 | B2 * | 5/2008 | Karnezos | H01L 25/105 |
| | | | | 257/686 |
| 7,671,459 | B2 * | 3/2010 | Corisis | H01L 21/561 |
| | | | | 257/686 |
| 8,310,041 | B2 * | 11/2012 | Chung | H01L 25/16 |
| | | | | 257/696 |
| 8,644,030 | B2 * | 2/2014 | Gibbons | H01L 25/0657 |
| | | | | 361/764 |
| 8,704,349 | B2 * | 4/2014 | Chow | H01L 21/561 |
| | | | | 257/686 |
| 8,779,583 | B2 * | 7/2014 | Pressel | H01L 25/50 |
| | | | | 257/684 |
| 9,257,419 | B2 * | 2/2016 | Yap | H01L 25/165 |
| 2006/0208363 | A1 * | 9/2006 | Shiu | H01L 23/49537 |
| | | | | 257/777 |
| 2006/0220209 | A1 * | 10/2006 | Karnezos | H01L 25/105 |
| | | | | 257/686 |
| 2007/0013038 | A1 * | 1/2007 | Yang | H01L 21/568 |
| | | | | 257/666 |
| 2007/0114648 | A1 * | 5/2007 | Karnezos | H01L 21/563 |
| | | | | 257/686 |
| 2008/0073761 | A1 | 3/2008 | Han et al. | |
| 2008/0303153 | A1 * | 12/2008 | Oi | H01L 21/563 |
| | | | | 257/738 |
| 2008/0303154 | A1 | 12/2008 | Huang et al. | |
| 2009/0160595 | A1 * | 6/2009 | Feng | H01F 17/0033 |
| | | | | 336/200 |
| 2009/0315547 | A1 | 12/2009 | Abwa et al. | |
| 2011/0147867 | A1 | 6/2011 | Slaughter et al. | |
| 2012/0268111 | A1 * | 10/2012 | Hiramoto | G01D 5/145 |
| | | | | 324/207.25 |
| 2012/0313233 | A1 * | 12/2012 | Boo | H01L 23/3107 |
| | | | | 257/676 |
| 2013/0069222 | A1 * | 3/2013 | Camacho | H01L 23/49827 |
| | | | | 257/737 |
| 2013/0304422 | A1 * | 11/2013 | Ausserlechner | G01R 33/07 |
| | | | | 702/189 |
| 2015/0155476 | A1 * | 6/2015 | Lin | H01L 43/02 |
| | | | | 324/252 |
| 2015/0159989 | A1 | 6/2015 | Kim | |
| 2016/0320459 | A1 * | 11/2016 | Mather | G01R 33/091 |
| 2017/0223829 | A1 * | 8/2017 | Ishikawa | H05K 1/115 |
| 2018/0294251 | A1 * | 10/2018 | Liu | H01L 25/0657 |

OTHER PUBLICATIONS

PCT International Search Report, dated Nov. 15, 2016, 12 pages.
International Search Report and Written Opinion of the International Searching Authority, dated Nov. 15, 2016, 12 pages.

* cited by examiner

ELECTRICAL STRUCTURAL MEMBER AND PRODUCTION METHOD FOR PRODUCING SUCH AN ELECTRICAL STRUCTURAL MEMBER

CROSS-REFERENCE TO RELATED APPLICATIONS

This application is a continuation of PCT International Application No. PCT/EP2016/001141, filed on Jul. 4, 2016, which claims priority under 35 U.S.C. § 119 to German Patent Application No. 102015008503.4, filed on Jul. 3, 2015.

FIELD OF THE INVENTION

The present invention relates to an electrical structural member and, more particularly, to an electrical structural member having a first semiconductor package and a second semiconductor package.

BACKGROUND

Semiconductor packages are used in many areas of application. Known semiconductor packages have a connection frame and a chip which is fitted to the connection frame. An encapsulation material encapsulates the chip and at least portions of the connection frame. In most known semiconductor packages, the encapsulation material encapsulates the entire connection frame of the semiconductor package except for outwardly directed electrical connectors.

The chip has a casing, also referred to as a housing or package, which includes chip connectors, for example, leads, pins, or balls. For such casings, there have been efforts at standardization, for example, by the JEDEC (previously Joint Electron Device Engineering Council, currently JEDEC Solid State Technology Association). A distinction is often made between wired "through-hole mountable" structural forms (Through Hole Technology—THT) and "surface-mountable" (Surface Mounted Technology—SMT) structural forms. The casing is used to fix the chip to a printed circuit board and the chip is connected to an intermediate material (also referred to as the connection frame or "leadframe"). Electrical connectors, for example wires, lead from the chip connectors to package connectors of the package. The package connectors may be leads, pins or balls.

Electrical structural members have a plurality of semiconductor packages. Known electrical structural members are constructed in a substantially cuboid manner and have a height smaller than the width; the width is often significantly smaller than the length and the height is often significantly smaller than the width. In such electrical structural members, it is problematic to connect the electrical structural members to a printed circuit board in an upright state in which one of the short sides abuts the printed circuit board.

SUMMARY

An electrical structural member according to the invention comprises a first package and a second package. The first package has a first connection frame, a chip disposed in the first connection frame, and a first encapsulation material encapsulating the chip and at least portions of the first connection frame. The second package has a second connection frame and a second encapsulation material encapsulating at least portions of the second connection frame. The first encapsulation material is securely connected to the second encapsulation material.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
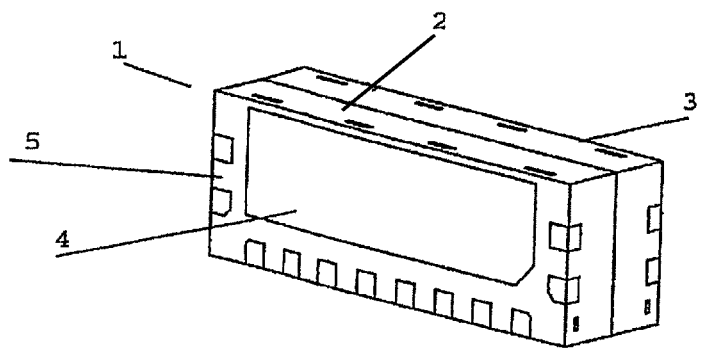
FIG. 1 is a perspective view of an electrical structural member according to the invention.

Exemplary embodiments of the present invention will be described hereinafter in detail with reference to the attached drawings, wherein like reference numerals refer to like elements. The present invention may, however, be embodied in many different forms and should not be construed as being limited to the embodiments set forth herein. Rather, these embodiments are provided so that the present disclosure will be thorough and complete and will fully convey the concept of the disclosure to those skilled in the art.

An electrical structural member 1 according to the invention is shown in FIGS. 1-5. The electrical structural member 1 includes a first package 2 and a second package 3.

The first package 2, as shown in FIGS. 1-5, has a first connection frame 4. A chip is fitted to the first connection frame 4. The chip is disposed in a first planar receiving face of the first connection frame 4. The first package 2 has encapsulation material 5 which encapsulates the chip and at least portions of the connection frame 4. In an embodiment, the first package 2 has a cuboid shape.

Figure 4:
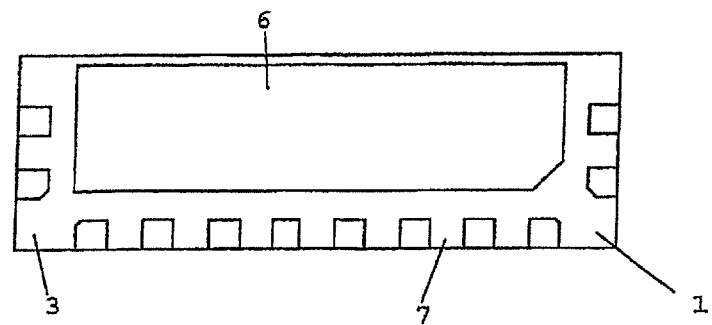
FIG. 4 is another side view of then electrical structural member.
Figure 5:
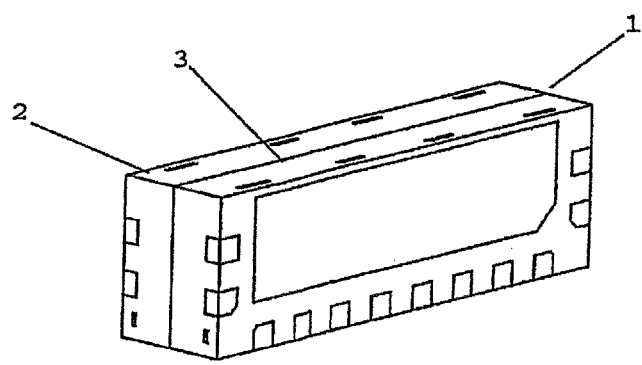
FIG. 5 is another perspective view of the electrical structural member.

The second package 3, as shown in FIG. 4, has a second connection frame 6. The second package 3 further has encapsulation material 7 which encapsulates at least portions of the second connection frame 6. In various embodiment, the second package 3 could have a chip in a second planar receiving face of the second connection frame 6 or alternatively could not have a chip in the second planar receiving face of the second connection frame 6. In an embodiment, the second package 3 has a cuboid shape.

In an embodiment, both the first package 2 and the second package 3 have a standardized surface-mountable structural form, that is to say, they are constructed as TDFN (Thin Dual Flat No-lead) packages. In other embodiments, the first package 2 and second package 3 are constructed as a DFN (Dual Flat No-lead Package), QFN (Quad Flat No Leads Package), VQFN (Very Thin Quad Flat pack), LCCC (Leadless Ceramic Chip Carrier), LGA MLPQ (Micro Leadframe Package Quad), MLPM (Micro Leadframe Package Micro), MLPD (Micro Leadframe Package Dual), DRMLF (Dual Row Micro Leadframe Package), UTDFN (Ultra Thin Dual Flat No-lead Package), XDFN (eXtreme thin Dual Flat No-lead Package), QFN (Quad Flat No-lead Package), QFN-TEP (Quad Flat No-lead package with Top Exposed Pad), TQFN (Thin Quad Flat No-lead Package), VQFN (Very Thin Quad Flat No Leads Package), DHVQFN (Dual in-line compatible thermal enhanced very thin quad flat package with no leads (NXP)). 0

Figure 2:
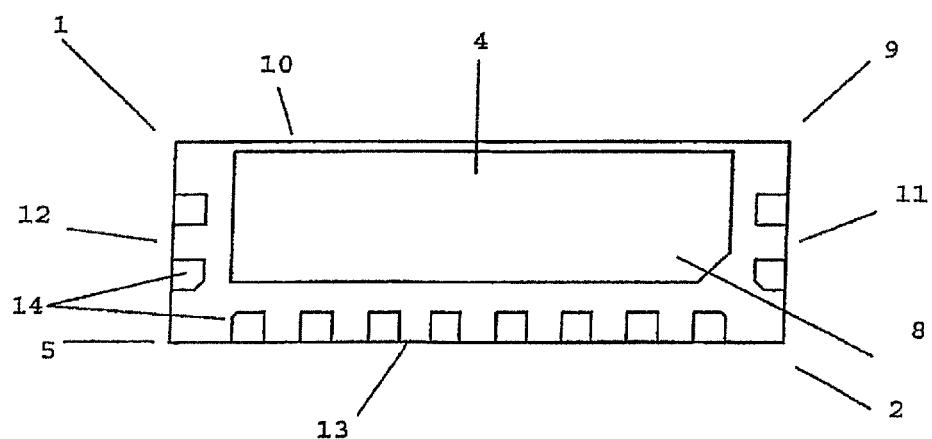
FIG. 2 is a side view of the electrical structural member.
Figure 3:
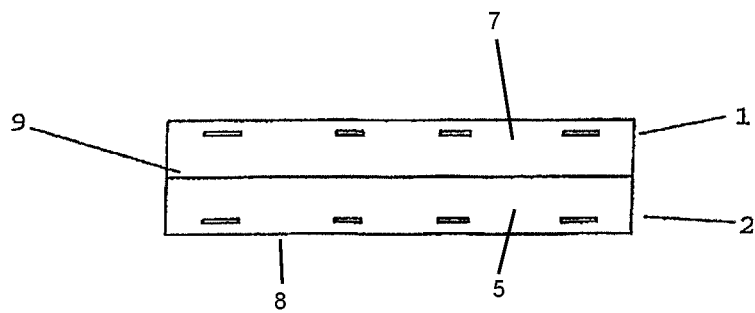
FIG. 3 is a plan view of the electrical structural member.

The first package 2, as shown in FIGS. 2 and 3, has a lower side 8, an upper side 9 which is opposite the lower side 8, and lateral faces 10, 11, 12, 13 which connect the upper side 9 and the lower side 8. The second package 3 is configured in a comparable manner and has comparable surfaces.

The upper side 9 of the first package 2 forms a first planar connection surface. The comparable surface of the second package 3 forms a second planar connection surface. The first planar connection surface is parallel with the first planar receiving face and the second planar connection surface is parallel with the second planar receiving face. As shown in FIGS. 1 and 3, the encapsulation material 5 of the first package 2 is securely connected to the encapsulation material 7 of the second package 3; the first planar connection surface is adhesively bonded to the second planar connection surface by the encapsulation materials 5, 7. The electrical structural member 1 has a cuboid shape.

The first package 2 has package connectors 14, as shown in FIGS. 1 and 2, constructed in the region of the edges of the first package 2. The package connectors 14 are each constructed along one of four edges of one of the lateral faces 10, 11, 12, 13 of the first package 2. Each lateral face 10, 11, 12, 13, at which the respective connector 14 is provided, has four edges: one edge to the lower side 9, one edge to the upper side 8, a first edge to a first additional lateral face 10, 11, 12, 13 and a second edge to a second additional lateral face 10, 11, 12, 13 which is arranged opposite the first lateral face 10, 11, 12, 13. Each respective connector 14, as shown in FIGS. 1 and 2, has a connection surface including a part-surface which is located in the surface of the respective lateral face 10, 11, 12, 13, an additional part-surface which is located in the surface of the adjacent lateral face 10, 11, 12, 13, and portion disposed along an edge between the respective lateral face 10, 11, 12, 13 and the adjacent lateral face 10, 11, 12, 13. In an embodiment, the first package 2 has connectors 14 only at two edges. In another embodiment, the first package 2 has connectors 14 at three edges arranged at right-angles relative to each other.

Figure 6:
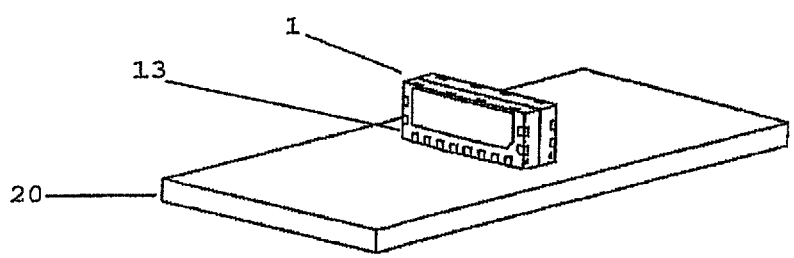
FIG. 6 is a perspective view of an electrical component according to the invention.

An electrical component according to the invention is shown in FIG. 6. The electrical component includes an electrical structural member 1 and a printed circuit board 20. The electrical structural member 1 is connected with the lateral face 13 to the printed circuit board 20. The printed circuit board 20 in an embodiment is a fixed printed circuit board produced from a fiber-reinforced plastic material. In other embodiments, the printed circuit board 20 can be made of Teflon, aluminum oxide, or ceramic material, or may be flexible printed circuit boards, for example, boards made of polyester film or Starrflex boards.

The connection is formed by soldering the connectors 14 at the edge relative to the lateral face 13; both the connectors 14 of the first package 2 and the comparable connectors of the second package 3 are soldered with respective connectors of the printed circuit board 20. Since solder connections are produced at both sides of the electrical structural member 1, the upright electrical structural member 1 is prevented from tilting towards one side.

The method of producing electrical structural members 1 according to the invention will now be described with reference to FIGS. 7-9.

Figure 7:
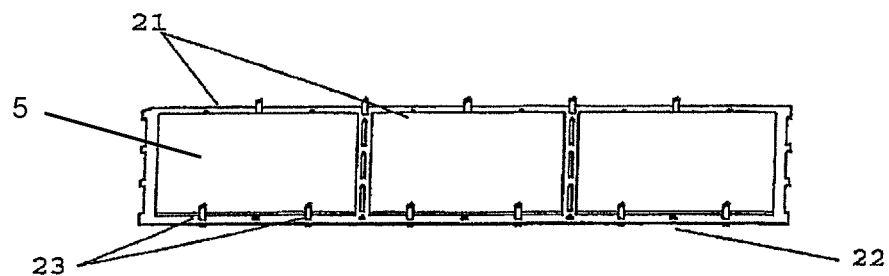
FIG. 7 is a plan view of a first frame used in a method of producing the electrical structural member.

A first frame 21 is initially provided in FIG. 7. The first frame 21 contains a plurality of connection frames 4. FIG. 7 shows the respective encapsulation material 5 of the first packages 2 which contain the respective connection frame 4 and the respective chip. The frame 21 has holes 22. The frame 21 is pushed with these holes 22 onto fixing pins 23 and therefore fixed in a position.

Figure 8:
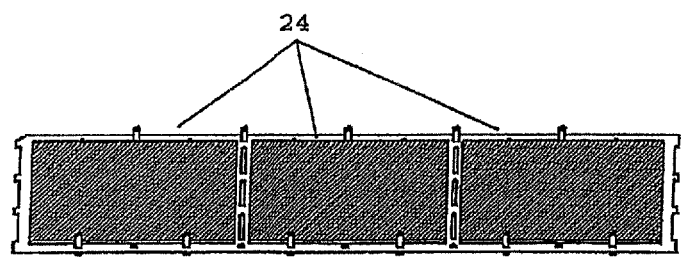
FIG. 8 is a plan view of the first frame with an adhesive.

In a next step shown in FIG. 8, an adhesive 24 is applied to the first planar connection surfaces of the first packages 2.

Figure 9:
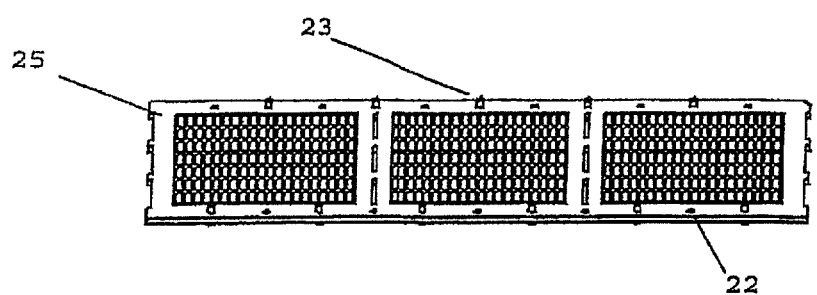
FIG. 9 is a plan view of the first frame joined to a second frame.

In a next step shown in FIG. 9, a second frame 25 which corresponds to the first frame 21 in terms of the design thereof is placed with the holes 22 thereof on the fixing pins 23 in an inverted manner. The second planar connection surfaces of the second packages 3 of the second frame 25 come into contact with the adhesive 24 and are securely connected after the curing of the adhesive 24 in a materially engaging manner by means of joining to the first connection surfaces of the first packages 2 of the first frame 21. During the curing, the first frame 21 and the second frame 25 can be pressed against each other. In other embodiments, friction welding or ultrasonic welding is used to join the encapsulation materials 5, 7 instead of the adhesive 24.

After the curing of the adhesive 24, the electrical structural members 1 are separated by sawing from the sandwich-like arrangement produced by the adhesive bonding of the first frame 21 to the second frame 25.

Figure 10:
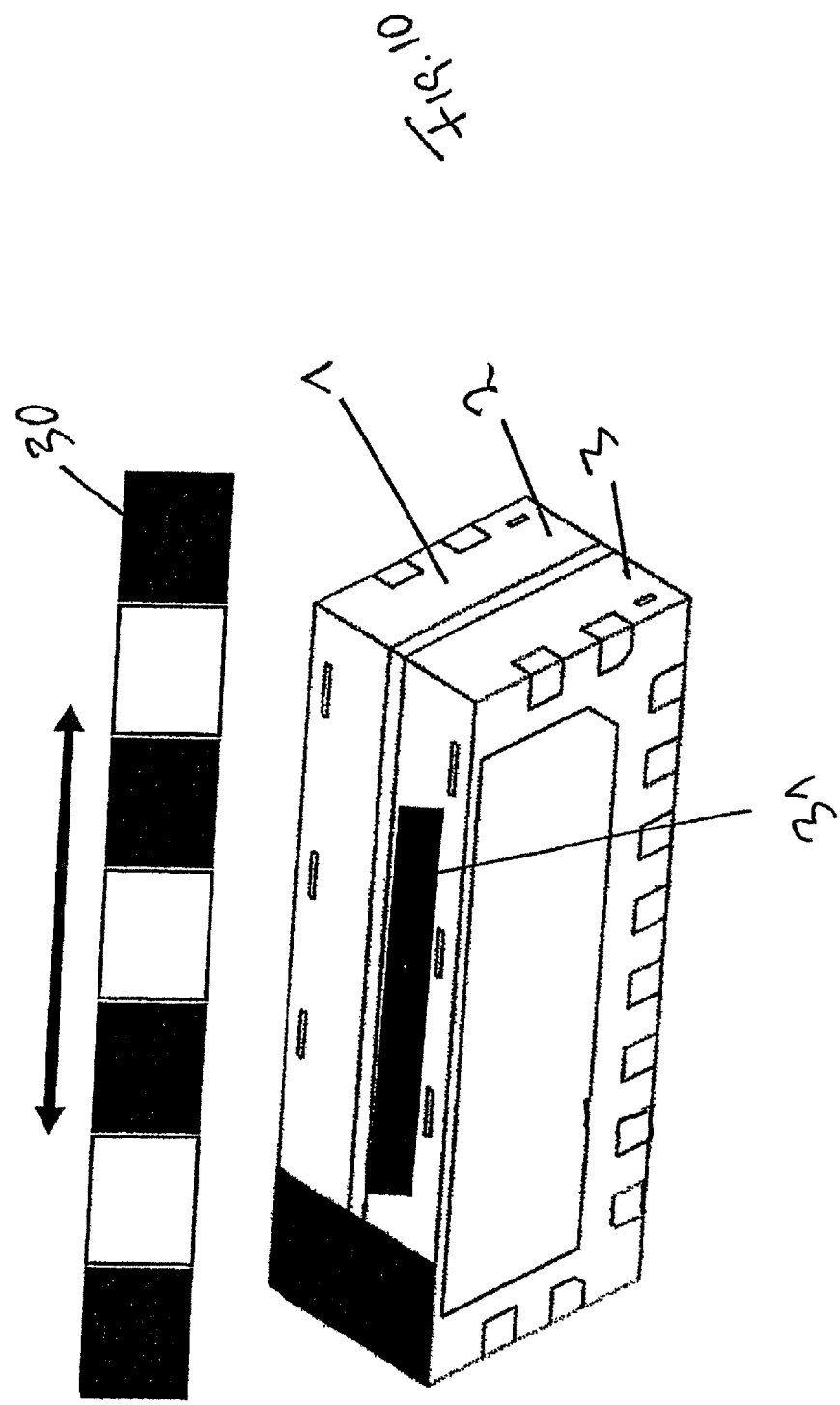
FIG. 10 is a perspective view of the electrical structural member with a magnetic-field-sensitive sensor.

An electrical structural member 1 is shown in FIG. 10 with a pole strip 30. The pole strip 30 can be moved relative to the electrical structural member 1 either by the pole strip 30 being fixed and the electrical structural member 1 being moved relative to the pole strip 30 or by the electrical structural member 1 being fixed and the pole strip 30 being moved, or by both the pole strip 30 and the electrical structural member 1 being moved, but at different speeds and/or speeds which are directed differently.

Figure 11:
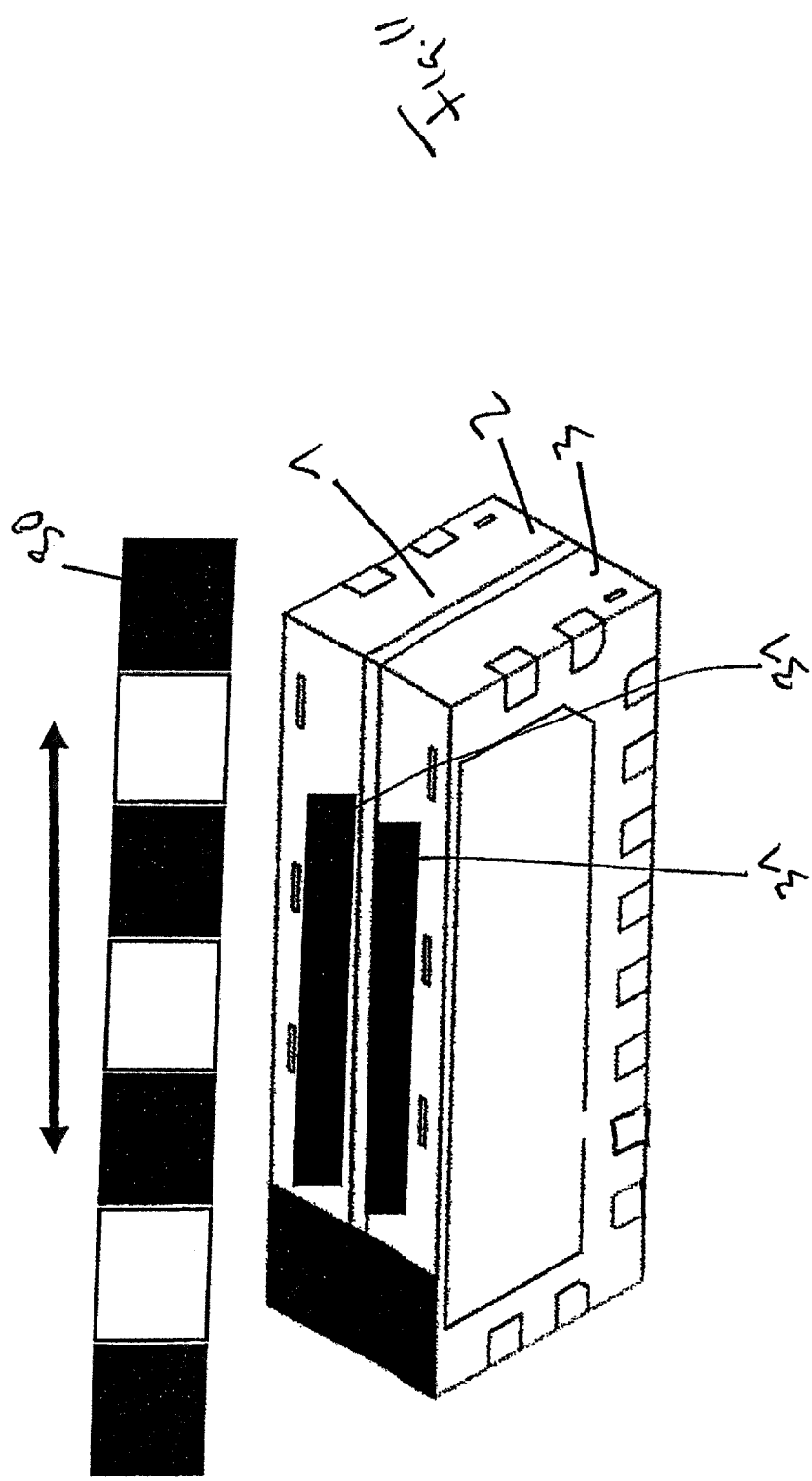
FIG. 11 is a perspective view of the electrical structural member with a plurality of magnetic-field-sensitive sensors.

A magnetic-field-sensitive sensor 31, as shown in FIG. 10, has a sensitive sensor layer disposed at an upper edge of the second package 3. The magnetic-field-sensitive sensor 31 is located nearer the pole strip 30 than the printed circuit board 20. In another embodiment shown in FIG. 11, another magnetic-field-sensitive sensor 31 is disposed at an upper edge of the first package 2, enabling redundant measurements.

In an embodiment, the chip of the package 2, 3 has the magnetic-field-resistive sensor 31. In various embodiments, the sensor 31 can have the anisotropic magnetoresistance effect (AMR effect) or the giant magnetoresistance effect (GMR effect). In other embodiments, the sensor 31 can also have other effects, such as, for example, Giant Magneto Impedance (GMI), Tunnel Magnetoresistance Effect (TMR) or the Hall effect, or all the sensors whose measurement direction is located in the Z axis.

Figure 12:
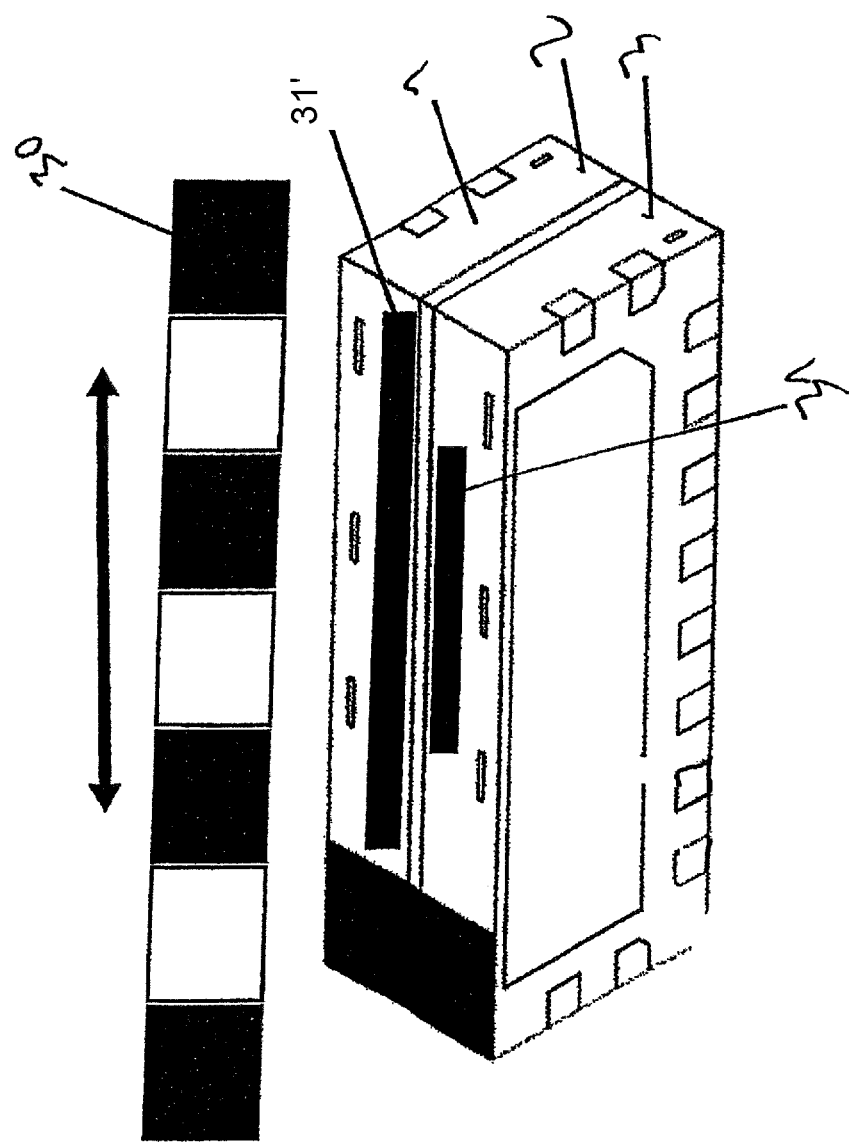
FIG. 12 is a perspective view of the electrical structural member with another plurality of magnetic-field-sensitive sensors.

In an embodiment shown in FIG. 12, a magnetic-field-sensitive sensor 31' disposed on the first package 2 is different than the magnetic-field-sensitive sensor 31 disposed on the second package 3. The magnetic-field-sensitive sensor 31 provided in the second package 3 is configured for a fine determination of a position, for example, in order to establish the position with a precision of 1 mm, while the sensor 31' in the first package 2 has a double or multiple reading width for a rough positioning.

Figure 13:
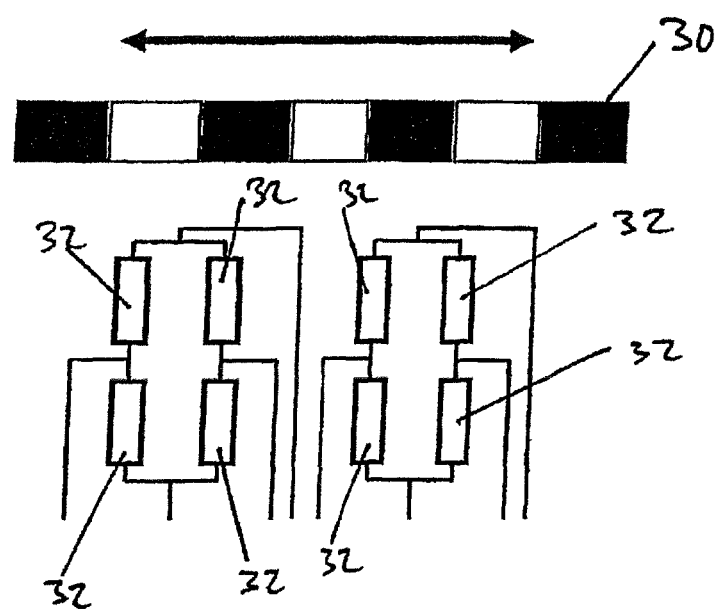
FIG. 13 is a schematic view of a magnetic-field-sensitive sensor.

Each magnetic-field-sensitive sensor 31, 31' has two Wheatstone bridges each with a plurality of sensor elements distributed locally over the chip; in the shown embodiment each Wheatstone bridge has four sensor elements embodied as resistors 32 connected in parallel as shown in FIG. 13. The resistors 32 are arranged with respect to the pole strip 30 as shown in FIG. 13. The resistors 32 are connected to each other in such a manner that local field direction or field strength differences between the Wheatstone bridges are used to produce a sensor signal which is dependent on a transmitter position or a transmitter angle relative to the sensor 31.

Figure 14:
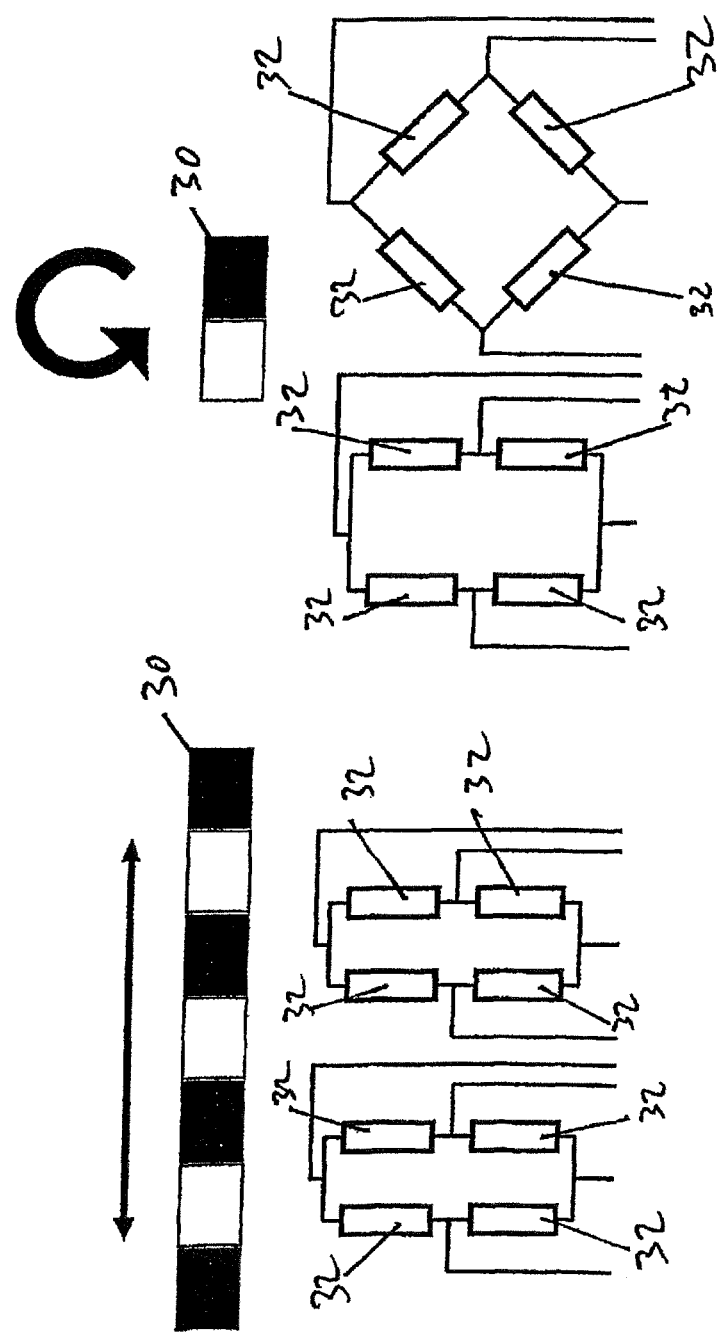
FIG. 14 is a schematic view of a plurality of different magnetic-field-sensitive sensors.

As shown in FIG. 14, in other embodiments, the magnetic-field-sensitive sensors 31 may be constructed differently from one another. A magnetic-field-sensitive sensor 31 constructed with two first Wheatstone bridges shown in FIG. 13 is shown on the left in FIG. 14. The magnetic-field-sensitive sensor 31 with two first Wheatstone bridges can be used as a path length sensor and, for example, can be fitted in the second package 3. The sensor 31 shown on the right in FIG. 14 differs from the one shown on the left in that the resistors 32 of the second Wheatstone bridge do not extend parallel with the resistors 32 of the first Wheatstone bridge but instead are positioned rotated 45° with respect thereto. Such a sensor 31 configuration is suitable for determining a rotation angle and, in an embodiment, could be fitted in the first package 2. It is thereby possible to produce both a path length sensor and a rotation angle sensor using two different magnetoresistive sensors 31 with the electrical structural member 1 according to the invention.

What is claimed is:

1. An electrical structural member having a cuboid shape, comprising:
    a first package having a cuboid shape and a first connection frame, a chip disposed in the first connection frame, and a first encapsulation material encapsulating the chip and at least portions of the first connection frame forms a first connection surface and a plurality of package connectors exposed to an area exterior of the electrical structural member;
    a second package having a cuboid shape and a second connection frame and a second encapsulation material encapsulating at least portions of the second connection frame forms a second connection surface, the first encapsulation material securely connected and abutted with the second encapsulation material and the first connection surface is joined to the second connection surface and a plurality of package connectors exposed to an area exterior of the electrical structural member; and
    wherein one of the plurality of package connectors from the first package and/or the second package are disposed on an edge of one of a plurality of lateral faces of the first package and/or the second package, the lateral faces each having one edge on a lower side, one edge on a upper side a first edge to a first additional lateral face and a second edge to a second additional lateral face which is arranged opposite the first lateral face, with each one of the connectors having a connection surface including a part-surface which is located in the surface of the respective lateral face and an additional part-surface which is located in the surface of the adjacent lateral face and portion disposed along an edge between the respective lateral face.

2. The electrical structural member of claim 1, wherein the chip is disposed at a first planar receiving face of the first connection frame and the first connection surface is parallel with the first planar receiving face.

3. The electrical structural member of claim 2, wherein the second connection frame has a second planar receiving face and the second connection surface is parallel with the second planar receiving face.

4. The electrical structural member of claim 1, wherein the first connection frame and the first encapsulation material are constructed in a mirror-symmetric manner relative to the second connection frame and the second encapsulation material with respect to a plane which is parallel with the first connection surface and the second connection surface and arranged centrally between the first connection surface and the second connection surface.

5. The electrical structural member of claim 1, wherein the chip has a magnetic-field-sensitive sensor.

6. The electrical structural member of claim 5, wherein the magnetic-field-sensitive sensor has an AMR, GMR or TMR effect.

7. The electrical structural member of claim 6, wherein the magnetic-field-sensitive sensor has at least one Wheatstone bridge which comprises a plurality of sensor elements distributed locally over the chip.

8. The electrical structural member of claim 5, further comprising a plurality of magnetic-field-sensitive sensors.

9. The electrical structural member of claim 8, wherein the plurality of magnetic-field-sensitive sensors are all of a same type.

10. The electrical structural member of claim 8, wherein the plurality of magnetic-field-sensitive sensors are of at least two different types.

11. A method for producing an electrical structural member having a cuboid shape, comprising:
    providing a first package having a cuboid shape and a first connection frame, a chip disposed in the first connection frame, and a first encapsulation material encapsulating the chip and at least portions of the first connection frame forming a first connection surface and a plurality of package connectors exposed to an area exterior of the electrical structural member;
    providing a second package having a cuboid shape and a second connection frame and a second encapsulation material encapsulating at least portions of the second connection frame forming a second connection surface, and the first connection surface is joined to the second connection surface and a plurality of package connectors exposed to an area exterior of the electrical structural member;
    connecting and abutting with the first encapsulation material to the second encapsulation material; and
    providing one of the plurality of package connectors from the first package and/or the second package disposed on an edge of one of a plurality of lateral faces of the first package and/or the second package, the lateral faces each having one edge on a lower side, one edge on a upper side a first edge to a first additional lateral face and a second edge to a second additional lateral face which is arranged opposite the first lateral face, with each one of the connectors having a connection surface including a part-surface which is located in the surface of the respective lateral face and an additional part-surface which is located in the surface of the adjacent lateral face and portion disposed along an edge between the respective lateral face.

12. The method of claim 11, wherein the step of providing the first package includes providing a first frame containing a plurality of first connection frames each encapsulated by the first encapsulation material.

13. The method of claim 12, wherein the step of providing the second package includes providing a second frame containing a plurality of second connection frames each encapsulated by the second encapsulation material.

14. The method of claim 13, wherein a first connection surface is formed on the first encapsulation material and a second connection surface is formed on the second encapsulation material, and the first connection surface is joined to the second connection surface.

15. An electrical component, comprising:
a printed circuit board; and
an electrical structural member having a cuboid shape connected to the printed circuit board and including:
a first package having a cuboid shape and a first connection frame, a chip disposed in the first connection frame, and a first encapsulation material encapsulating the chip and at least portions of the first connection frame forms a first connection surface and a plurality of package connectors exposed to an area exterior of the electrical structural member;
a second package having a cuboid shape and a second connection frame and a second encapsulation material encapsulating at least portions of the second connection frame forms a second connection surface, the first encapsulation material securely connected and abutted with the second encapsulation material and the first connection surface is joined to the second connection surface and a plurality of package connectors exposed to an area exterior of the electrical structural member; and wherein one of the plurality of package connectors from the first package and/or the second package are disposed on an edge of one of a plurality of lateral faces of the first package and/or the second package, the lateral faces each having one edge on a lower side, one edge on a upper side a first edge to a first additional lateral face and a second edge to a second additional lateral face which is arranged opposite the first lateral face, with each one of the connectors having a connection surface including a part-surface which is located in the surface of the respective lateral face and an additional part-surface which is located in the surface of the adjacent lateral face and portion disposed along an edge between the respective lateral face.

16. The electrical component of claim 15, wherein the electrical structural member has a cuboid shape with an upper side, a lower side opposite the upper side, and a plurality of lateral faces connecting the upper side and he lower side, one of the plurality of the lateral faces abutting and connected to the printed circuit board.

* * * * *